United States Patent
Jeong et al.

(10) Patent No.: US 7,667,998 B2
(45) Date of Patent: Feb. 23, 2010

(54) PHASE CHANGE MEMORY DEVICE AND METHOD OF FORMING THE SAME

(75) Inventors: Won-Cheol Jeong, Seoul (KR); Se-Ho Lee, Seoul (KR); Jae-Hyun Park, Yongin-si (KR); Chang-Wook Jeong, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 488 days.

(21) Appl. No.: 11/507,573

(22) Filed: Aug. 22, 2006

(65) Prior Publication Data

US 2007/0076486 A1    Apr. 5, 2007

(30) Foreign Application Priority Data

Aug. 30, 2005  (KR)  .................. 10-2005-0080183

(51) Int. Cl.
  G11C 11/00   (2006.01)
  H01L 27/16   (2006.01)
  H01L 21/20   (2006.01)

(52) U.S. Cl. .................. 365/148; 365/163; 257/2; 257/E21.536; 257/E29.143; 438/382

(58) Field of Classification Search ................ 365/148, 365/163; 257/2–5, E21.536, E29.143; 438/382
See application file for complete search history.

(56) References Cited

U.S. PATENT DOCUMENTS

| | | | |
|---|---|---|---|
| 5,980,785 A * | 11/1999 | Xi et al. ...................... | 252/512 |
| 6,569,705 B2 | 5/2003 | Chiang et al. | |
| 6,797,979 B2 | 9/2004 | Chiang et al. | |
| 6,849,892 B2 * | 2/2005 | Hideki ....................... | 257/298 |
| 6,869,883 B2 | 3/2005 | Chiang et al. | |
| 6,891,749 B2 * | 5/2005 | Campbell et al. ........... | 365/163 |
| 7,115,927 B2 * | 10/2006 | Hideki et al. ............... | 257/296 |
| 7,129,560 B2 * | 10/2006 | Hamann et al. ............. | 257/529 |
| 7,215,564 B2 * | 5/2007 | Happ et al. ................. | 365/105 |
| 7,236,388 B2 * | 6/2007 | Hosoi et al. ................ | 365/148 |
| 2005/0029504 A1 | 2/2005 | Karpov | |
| 2005/0104231 A1 | 5/2005 | Chiang et al. | |
| 2009/0059651 A1 * | 3/2009 | Aoki .......................... | 365/148 |

FOREIGN PATENT DOCUMENTS

KR    1020040017694 A    2/2004

(Continued)

OTHER PUBLICATIONS

Cuong et al., "Characterizations of high resistivity TiNxOy thin films for applications in thin film resistors," (Mar. 2007) Microelectronics Reliability No. 47, pp. 752-754.*

*Primary Examiner*—Evan Pert
(74) *Attorney, Agent, or Firm*—Volentine & Whitt, PLLC

(57) ABSTRACT

A PRAM and method of forming the same are disclosed. In various embodiments, the PRAM includes a lower insulation layer formed on a semiconductor substrate, a phase change material pattern formed on the lower insulation layer and a heating electrode contacting the phase change material pattern. The heating electrode can be formed of a material having a positive temperature coefficient such that specific resistance of the material increases as a function of temperature.

16 Claims, 10 Drawing Sheets

FOREIGN PATENT DOCUMENTS

| | | |
|---|---|---|
| KR | 1020040078464 A | 9/2004 |
| KR | 1020040100499 A | 12/2004 |
| KR | 1020040079451 A | 8/2008 |
| TW | 552681 | 9/2003 |
| TW | 559915 | 11/2003 |
| TW | 579593 | 3/2004 |
| TW | I229864 | 3/2005 |

* cited by examiner

PHASE CHANGE MEMORY DEVICE AND METHOD OF FORMING THE SAME

BACKGROUND OF THE INVENTION

1. Field of the Invention

The present invention relates to a semiconductor device, and more particularly to a phase change memory device and a method of forming the same.

2. Description of the Related Art

A phase change random access memory (PRAM) is a memory device that uses a material that changes its phase, e.g., amorphous to crystalline, as a mechanism to store data. Generally, PRAM memories may resemble dynamic random access memory (DRAM) devices with their capacitors replaced by an appropriate phase change material. Note that phase change materials have different resistance values as a function of their underlying phase state, which can vary from a generally amorphous state to a more crystalline state. The amorphous state of a phase change material will typically have a higher specific resistance than that of the crystal state, and using this difference of specific resistance it is possible to determine whether data recorded on the phase change material is a logic "1" or a logic "0" by detecting a voltage change and/or a current change caused by difference of this specific resistance.

A representative example of a phase change material may include a compound containing germanium (Ge), tellurium (Te) and antimony (Sb)—generally referred to as GST. A PRAM using this phase change material can have the benefit of being non-volatile, i.e., it can maintain its stored data even when power is removed. Another benefit of PRAM memory is its high durability in that data can be written and rewritten billions of times.

The phase of a phase change material memory cell can be changed to an amorphous state or a crystalline state based on an amount of heat applied thereto. More particularly, the phase change material may be converted into an amorphous state by supplying heat of temperature higher than a melting point to the phase change material during a first time interval. In contrast, the phase change material may be converted into a crystalline state by supplying heat lower than the melting point to the phase change material during a second time interval that is longer than the first time interval.

Generally, PRAM devices use Joule (ohmic) heating to set the state of its phase change materials. That is, by forming a contact plug-shaped heater on the lower surface of the phase change material and applying a program current through the heater the temperature of the heater (along with the phase change material) may be controlled so that the phase change material may be converted into an amorphous state or a crystalline state. Note that the heater may be connected to source/drain regions of a metal oxide semiconductor (MOS) transistor (formed on a semiconductor substrate) acting as the current switch for the heater.

It should be appreciated that the heat required for converting a state of the phase change material is generally very high. For example, the GST material discussed above requires high temperature of at least about 600° C. Generating such a high temperature can greatly add to the power consumption of the PRAM. Also, in situations where the channel width of the MOS transistor is widened in order to supply high program currents, the overall area of the PRAM cell proportionately increases, which tends to make high integration more difficult. Thus, new technology relating to PRAM devices is desirable.

SUMMARY OF THE INVENTION

The present invention provides a PRAM, and method of forming the same, capable of reducing the current required for program operations.

Embodiments of the present invention provide a PRAM including a lower insulation layer formed on a semiconductor substrate, a phase change material pattern formed on the lower insulation layer, and a heating electrode contacting the phase change material pattern, wherein the heating electrode is formed of a material having a positive temperature coefficient such that specific resistance of the material increases with temperature.

In various illustrative embodiments, the heating electrode may be formed of a material having a critical temperature at which specific resistance of the material rapidly increases. The heating electrode may be formed of a material containing Ti, Ba, and O. Also, the heating electrode may be formed of a material further including at least one selected from the group consisting of La, Y, Gd, Sn, Ce, Sm, Dy, Nb, Sb, Ta, Pb, Sr, Zr, Mn, AlO, and $SiO_2TiO_3$.

In various illustrative embodiments, the heating electrode may fill a contact hole passing through the lower insulation layer located under the phase change material pattern to contact a lower surface of the phase change material pattern.

In various illustrative embodiments, the heating electrode may be disposed inside a contact hole passing through the lower insulation layer located under the phase change material pattern to contact a lower surface of the phase change material pattern. In this case, the PRAM may further include an auxiliary heating electrode filling a portion of the contact hole formed under the heating electrode and contacting a lower surface of the heating electrode.

In various illustrative embodiments, the heating electrode may be interposed between the phase change material pattern and the lower insulation layer to contact an entire lower surface of the phase change material pattern.

In various illustrative embodiments, the PRAM may further include an upper insulation layer covering an entire surface of the substrate. At this point, the heating electrode may fill a contact hole passing through the upper insulation layer and exposing the phase change material pattern to contact an upper surface of the phase change material pattern.

In various illustrative embodiments, the PRAM may further include an upper insulation layer covering an entire surface of the substrate, and an auxiliary heating electrode located inside a contact hole passing through the upper insulation layer and exposing the phase change material pattern. In this case, the heating electrode may be located inside the contact hole formed between the phase change material pattern and the auxiliary heating electrode to contact an upper surface of the phase change material pattern.

In various illustrative embodiments, the heating electrode may be located on the phase change material pattern to contact an entire upper surface of the phase change material pattern. In this case, the PRAM may further include an upper insulation layer covering an entire surface of the substrate, and an auxiliary heating electrode filling a contact hole passing through the upper insulation layer and exposing the heating electrode to contact the heating electrode.

In various illustrative embodiments, a method of forming a PRAM, the method including forming a lower insulation layer on a semiconductor substrate, and forming a phase change material pattern and a heating electrode, the phase change material pattern disposed on the lower insulation layer and the heating electrode contacting the phase change material pattern, wherein the heating electrode is formed of a material having a positive temperature coefficient such that specific resistance of the material increases with temperature.

In various illustrative embodiments, the heating electrode may be formed of a material having a critical temperature at which specific resistance of the material rapidly increases.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
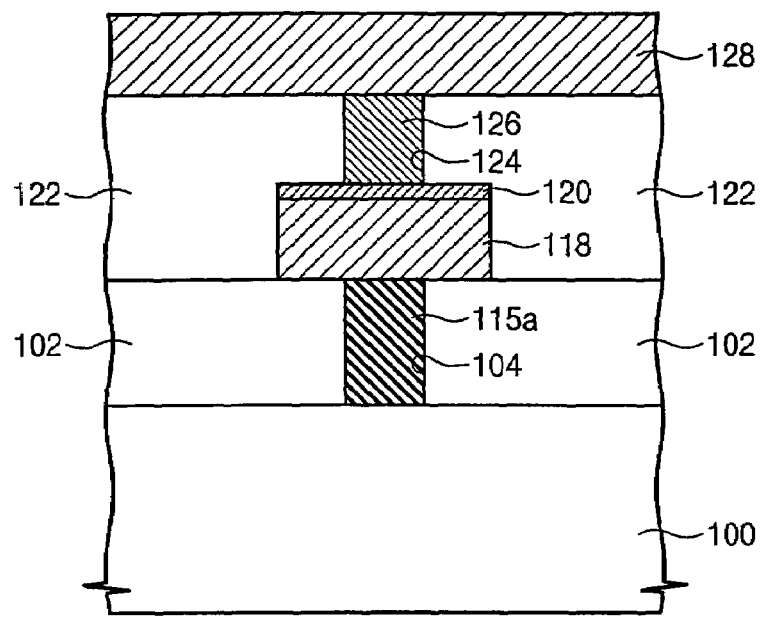
FIG. 1 is a cross-sectional view of a PRAM according to an illustrative embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions may be exaggerated for clarity. It will also be understood that when a layer is referred to as being "on" another layer or substrate, it can be either directly in contact with the other layer or substrate or intervening layers may also be present. Like reference numerals in the drawings denote like elements throughout the specification.

FIG. 1 is a cross-sectional view of a PRAM according to an illustrative embodiment of the present invention. As shown in FIG. 1, a lower insulation layer 102, made of silicon oxide or some other appropriate material, a phase change material pattern 118 and an electrode 120 can be sequentially stacked upon on a semiconductor substrate 100. Sidewalls of the exemplary phase change material pattern 118 are aligned to those of the electrode 120. Note that the electrode 120 can make contact with the entire upper surface of the phase change material pattern 118.

The phase change material pattern 118 can be formed of a compound of a combination of one or more of Te and Se, which are chalcogenide elements, as well as one or more of Ge, Sb, Bi, Pb, Sn, Ag, As, S, Si, P, O, and N. For example, the exemplary phase change material pattern 118 may be formed of Ge—Sb—Te, As—Sb—Te, As—Ge—Sb—Te, Sn—Sb—Te, Ag—In—Sb—Te, In—Sb—Te, an element in a group 5A-Sb—Te, an element in a group 6A-Sb—Te, an element in a group 5A-Sb—Se, or an element in a group 6A-Sb—Se.

The electrode 120 may be formed of a conductive metal nitride, such as titanium nitride, tantalum nitride, tungsten nitride, titanium nitride aluminum and so on.

A heating electrode 115$a$ can be located inside a first contact hole 104 passing through the lower insulation layer 102 to make contact with a predetermined region of the lower surface of the phase change material pattern 118. The lower surface of the heating electrode 115$a$ may be electrically connected to source/drain regions of a MOS transistor (not shown) formed on the substrate 100. In various embodiments, the phase change material pattern 118 may have a wider lower surface than an upper surface of the heating electrode 115$a$. The exemplary heating electrode 115$a$ may also completely fill the first contact hole 104 as illustrated.

In various embodiments, the heating electrode 115$a$ can be formed of a material having a positive temperature coefficient such that specific resistance of the material increases with temperature. That is, the heating electrode 115$a$ can have a low specific resistance at low temperature and have a high specific resistance at high temperature. In addition to having a positive temperature coefficient, the heating electrode 115$a$ can be formed of a material having a critical temperature at which specific resistance of the material rapidly increases.

Figure 2:
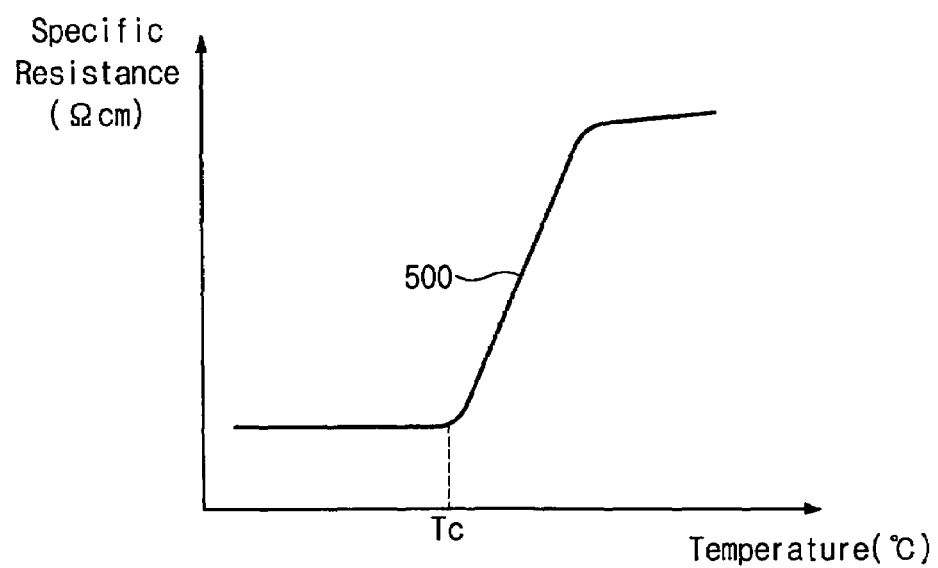
FIG. 2 is a graph explaining characteristics of a heating electrode according to an embodiment of the present invention.

An exemplary resistance-versus-temperature characteristic of the heating electrode 115$a$ will be described in more detail with reference to FIG. 2, which depicts a graph having an x-axis representing temperature and a y-axis representing specific resistance. Note that the y-axis is represented in a log scale. As shown in FIG. 2, a solid line 500 is presented to illustrate the specific resistance versus temperature characteristic of a barium titanate compound, which can be used for the heating electrode 115$a$. According to the solid line 500, the heating electrode 115$a$ has low specific resistance at low temperature, which can be exploited during reading operations. However, because the specific resistance rapidly increases as temperature is raised above critical temperature Tc, the heating electrode 115$a$ can exploit the high specific resistance during a program operation.

In various embodiments, the material of FIG. 2 (and of the heating electrode 115$a$) may be formed of a compound containing Ti, Ba, and O (referred to as a barium titanate compound). It should be appreciated that the specific resistance of the barium titanate compound at high temperature may be several thousand to several tens of thousands greater than specific resistance of the barium titanate at low temperature. In various embodiments, the heating electrode 115$a$ may be formed of the barium titanate compound including at least one of La, Y, Gd, Sn, Ce, Sm, Dy, Nb, Sb, Ta, Pb, Sr, Zr, Mn, AlO, and $SiO_2TiO_3$. Also note that La, Y, Gd, Sn, Ce, Sm, Dy, Nb, Sb, or Ta may be added to the barium titanate compound to enhance conductivity of the heating electrode 115$a$. That is, La, Y, Gd, Sn, Ce, Sm, Dy, Nb, Sb, or Ta may decrease the specific resistance of the heating electrode 115a under low temperatures. Also note that Sn, Pb, Sr or Zr may be added to the barium titanate compound to change the critical temperature Tc. Additionally, Mn may be also added to the barium titanate compound to enhance a characteristic of the heating electrode 115a. Still further, AlO or $SiO_2TiO_3$ may be added to the barium titanate compound to facilitate sintering of the heating electrode 115a or control a diameter of a gain.

Returning to FIG. 1, an upper insulation layer 122 can cover the entire surface of the substrate 100, and a plug 126 can fill a second contact hole 124 passing through the upper insulation layer 122 to electrically expose the electrode 120 to an electric line 128 located atop of the upper insulation layer 122. The exemplary electric line 128 may be formed of tungsten, aluminum, or copper, while the exemplary plug 126 may be formed of conductive metal nitride such as titanium nitride, tantalum nitride, tungsten nitride, and titanium nitride aluminum. However, in certain embodiments, the plug 126 may be simply be a portion of the electric line 128 wherein both the electric line 128 and the plug 126 may be formed of tungsten, aluminum or copper.

According to the PRAM having the above-described structure, the heating electrode 115a can be formed of a material having specific resistance that increases with temperature. Accordingly, the heating electrode 115a has low specific resistance during read operations where heat is not supplied, but has high specific resistance during program operations where substantial heat is supplied. Consequently, even when the specific resistance of the heating electrode 115a increases, it is possible to supply heat of sufficient temperature to the phase change material pattern 118 and thus reduces the program current during the program operation. That is, it is possible to realize a PRAM of low power consumption and high integration by reducing the requisite programming current of the PRAM.

Also note that because the specific resistance of the heating electrode 115a rapidly increases at the critical temperature Tc. the switching characteristic of a specific resistance change of the heating electrode 115a can be selected to reduce programming time. In addition, because the specific resistance of the heating electrode 115a can be maintained to a low level during the read operations, such read operations can also be swiftly performed.

While the exemplary heating electrode 115a of FIG. 1 completely fills the first contact hole 104, in other embodiments a heating electrode may be modified to other forms, which will be described below.

Figure 3:
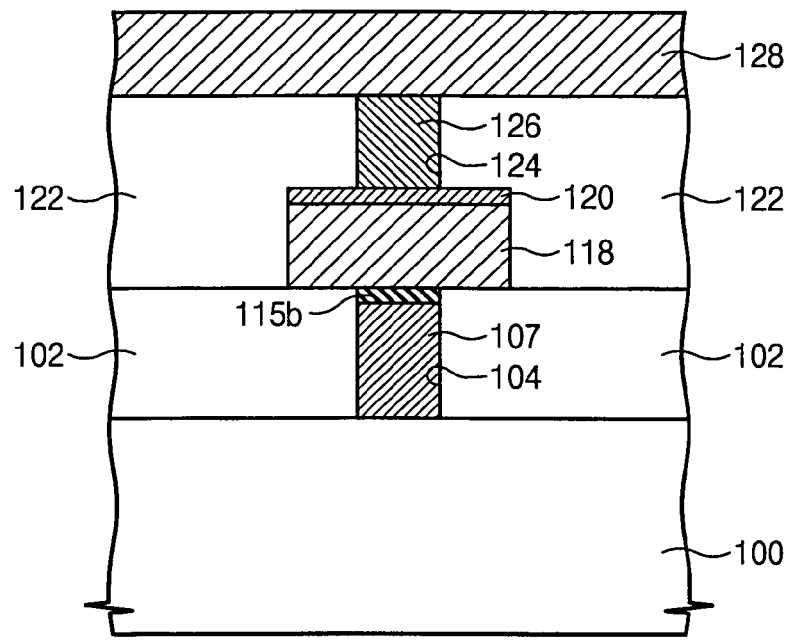
FIG. 3 is a cross-sectional view illustrating another illustrative embodiment of a PRAM according to an embodiment of the present invention.

FIG. 3 is a cross-sectional view illustrating another embodiment of a PRAM. As shown in FIG. 3, a first contact hole 104 passing through a lower insulation layer 102 can be located under a phase change material pattern 118. A heating electrode 115b contacting the phase change material pattern 118 can be located inside the first contact hole 104 with an auxiliary heating electrode 107 located inside the first contact hole 104 and under the heating electrode 115b. That is, the lower portion of the first contact hole 104 is filled with the auxiliary heating electrode 107, and the upper portion of the first contact hole 104 is filled with the heating electrode 115b. In various embodiments, the height/thickness of the auxiliary heating electrode 107 may be greater than that of the heating electrode 115b, which may have a thickness of several angstrom to tens of nanometer.

In various embodiments, the heating electrode 115b of FIG. 3 can be formed of the same material as that of the heating electrode 115a illustrated in FIG. 1 while the exemplary heating electrode 107 may be formed of a conductive metal nitride, such as titanium nitride, tantalum nitride, tungsten nitride, titanium nitride aluminum and so on.

A PRAM having the heating electrode 115b of FIG. 3 may have the advantageous effects described with reference to FIGS. 1 and 2. In addition, since the heating electrode 115b is relatively thin, its resistance at low temperatures can be minimized due to the shortening of the current path through heating electrode 115b, which can in turn shorten read operation times.

Figure 4:
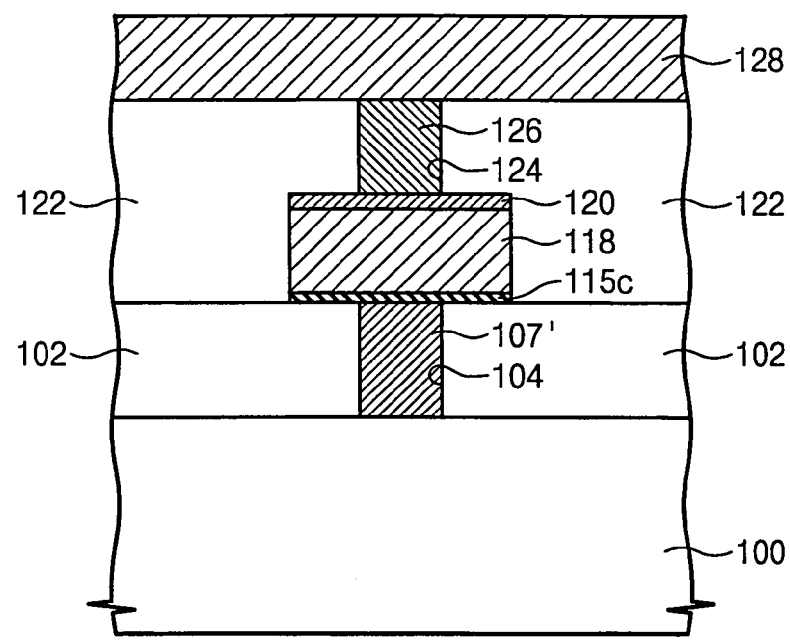
FIG. 4 is a cross-sectional view illustrating another illustrative embodiment of a PRAM according to an embodiment of the present invention.

Continuing, FIG. 4 is a cross-sectional view illustrating another exemplary embodiment of a PRAM is presented. As shown in FIG. 4, the heating electrode 115c is no longer placed within contact hole 104, but is located above the lower insulation layer 102 yet still below the phase change material pattern 118. In the present embodiment, the heating electrode 115c makes contact with the entire lower surface of the phase change material pattern 118, and the sidewalls of the heating electrode 115c are aligned with those of the phase change material pattern 118 an electrode 120. The heating electrode 115c may have a thickness ranging from several angstrom to tens of nanometer, and again the heating electrode 115c may be thinner than the electrode 120.

In the present embodiment, the auxiliary heating electrode 107' completely fills a first contact hole 104 formed in the lower insulation layer 102 under the phase change material pattern 118, and makes contact with part of the lower surface of the heating electrode 115c. Note that the auxiliary heating electrode 107' may be formed of the same material as that of the auxiliary heating electrode 107 illustrated in FIG. 3.

According to the PRAM embodiment of FIG. 4, the effects described with reference to FIGS. 1 and 2 may be obtained, and yet the effects described with reference to FIG. 3 may also be obtained due to the thinness of the auxiliary heating electrode 107'.

A method of forming the PRAM of FIG. 1 will now be described below using FIGS. 5 through 7, which depict cross-sectional views of intermediate steps explaining a method of forming the PRAM.

Figure 5:
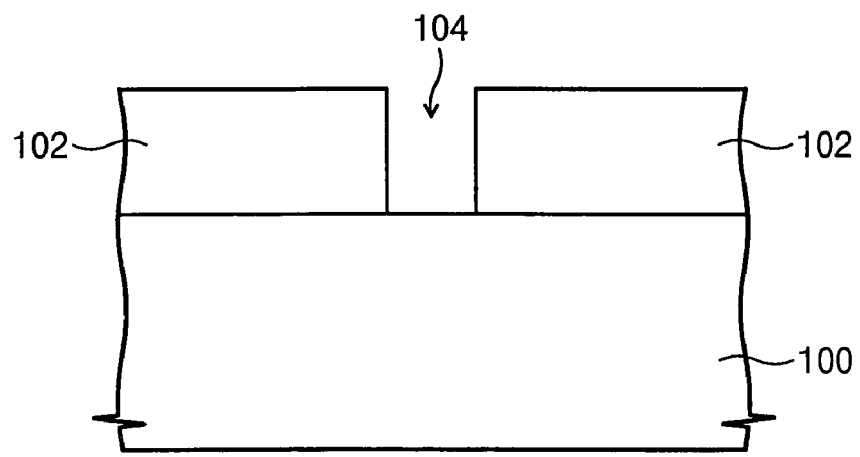
FIGS. 5 through 7 are cross-sectional views explaining a method of forming the PRAM illustrated in FIG. 1.
Figure 6:
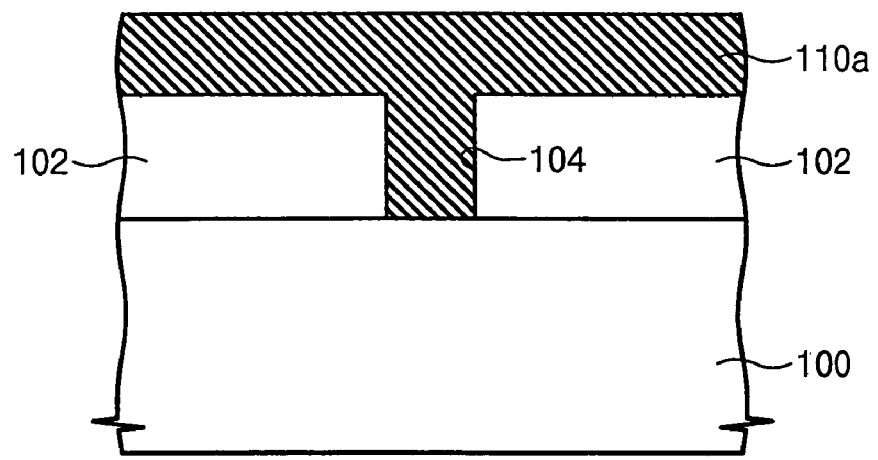

Referring to FIG. 5, a lower insulation layer 102 can be formed on substrate 100 with the lower insulation layer 102 modified to form a first contact hole 104 exposing the substrate 100. Next, in FIG. 6, a heating electrode layer 110a is shown as filling the first contact hole 104 as well as the entire surface of the substrate 100. The exemplary heating electrode layer 110a is formed of a material having a positive temperature coefficient such that specific resistance of the material increases with increasing temperature, and in various embodiments the heating electrode layer 110a may be formed of a material having a strategically engineered critical temperature. As mentioned above, the heating electrode layer 110a may be formed of a barium titanate compound containing Ti, Ba, and O. In addition, the heating electrode layer 110a may be formed of the barium titanate compound containing at least one of La, Y, Gd, Sn, Ce, Sm, Dy, Nb, Sb, Ta, Pb, Sr, Zr, Mn, AlO, and $SiO_2TiO_3$.

Figure 7:
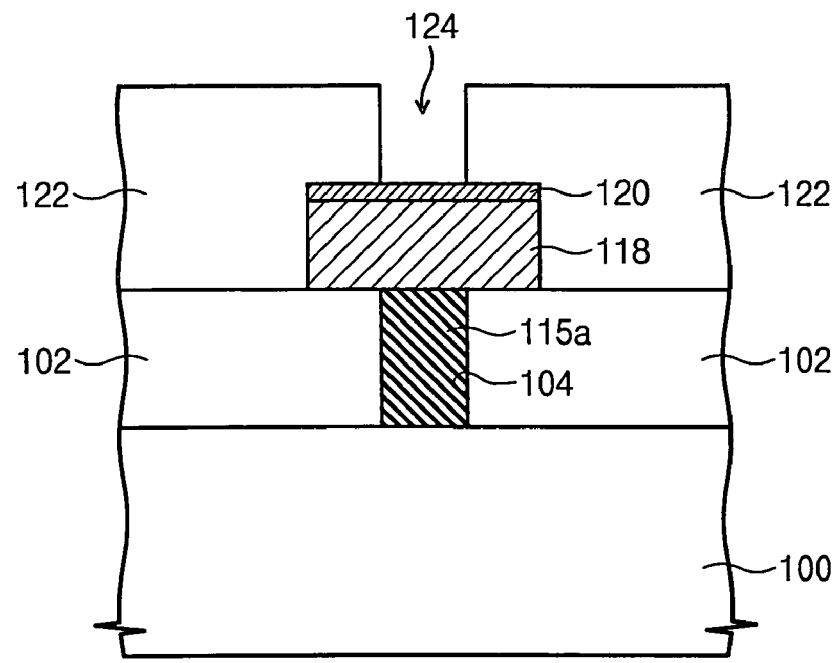

Next, referring to FIG. 7, the heating electrode layer 110a can then be planarized until the lower insulation layer 102 is exposed. Accordingly, heating electrode 115a filling the first contact hole 104 is formed. Then, a phase change material layer and an electrode layer are sequentially stacked atop the heating electrode 115a upon which the electrode layer and phase change material layer are patterned to form the phase change material pattern 118 and electrode 120. The phase change material pattern 118 contacts an upper surface of the heating electrode 115a. Note that the phase change material pattern 118 may have a wider lower surface than an upper surface of the heating electrode 115a.

Continuing, an upper insulation layer 122 can be formed on the entire surface of the substrate 100 and patterned to form a second contact hole 124 exposing a predetermined region of electrode 120. Subsequently, the plug 126 (of FIG. 1) filling the second contact hole 124, and the electric line 128 (of FIG. 1) located on the upper insulation layer 122 and contacting the plug 126 can be formed, thus realizing the PRAM illustrated in FIG. 1.

Figure 8:
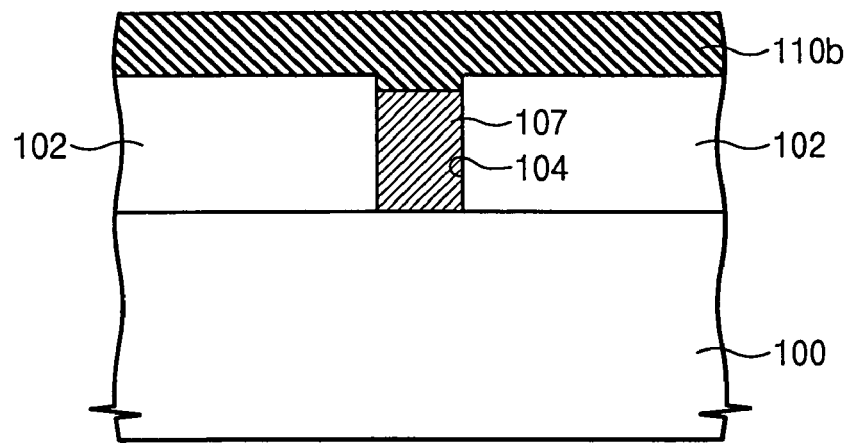
FIGS. 8 and 9 are cross-sectional views explaining a method of forming the PRAM illustrated in FIG. 3.

Next, a method of forming the PRAM illustrated in FIG. 3 is described with reference to FIGS. 8 and 9. As shown in FIG. 8, a lower insulation layer 102 is formed on a substrate 100 with the lower insulation layer 102 patterned to form a first contact hole 104 exposing the substrate 100. An auxiliary heating electrode layer filling the first contact hole 104 is formed on the entire surface of the substrate 100 after which the auxiliary heating electrode layer is planarized until the lower insulation layer 102 is exposed and the upper surface of a planarized auxiliary heating electrode layer filling the first contact hole 104 is both exposed and recessed below the upper surface of the lower insulation layer 102 thus forming the auxiliary heating electrode 107. Next, a heating electrode layer 110b filling the top portion of the first contact hole 104 is formed on the entire surface of the substrate 100.

Figure 9:
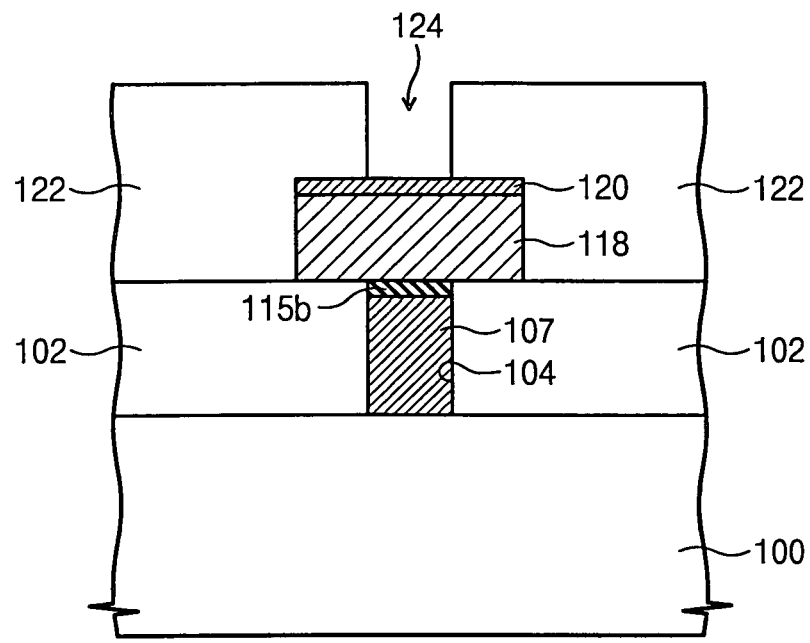

Continuing to FIG. 9, the heating electrode layer 110b is planarized until the lower insulation layer 104 is exposed and heating electrode 115b filling a portion of the first contact hole 104 is formed. Next, a phase change material layer and electrode layer are sequentially stacked on the surface of the substrate 100 after which they are patterned to form the phase change material pattern 118 and electrode 120. An upper insulation layer 122 can then be applied and patterned to form a second contact hole 124 exposing a predetermined region of the electrode 120. Subsequently, the plug 126 (of FIG. 3) filling the second contact hole 124 and the electric line 128 (of FIG. 3) located on the upper insulation layer 122 and contacting the plug 126 can be formed to realize the PRAM illustrated in FIG. 3.

Figure 10:
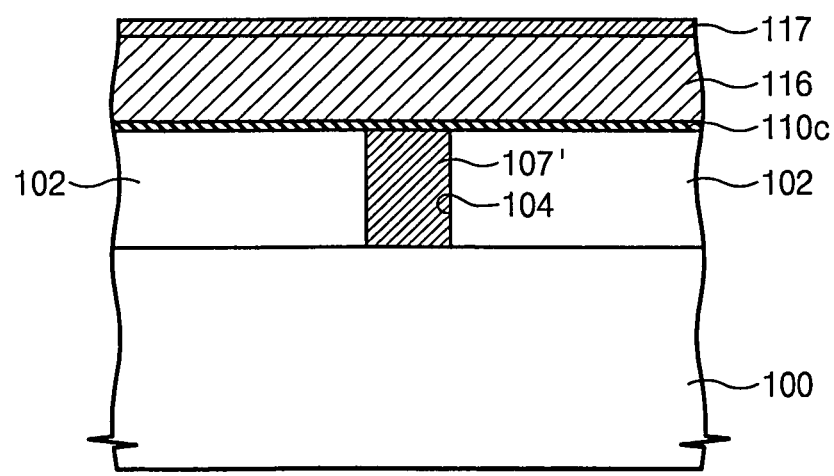
FIGS. 10 and 11 are cross-sectional views explaining a method of forming the PRAM illustrated in FIG. 4.

Next, a method of forming the PRAM illustrated in FIG. 4 will be described with reference to FIGS. 10 and 11. Referring first to FIG. 10, a lower insulation layer 102 can be formed on a substrate 100 and patterned to form a first contact hole 104 exposing the substrate 100. An auxiliary heating electrode layer filling the first contact hole 104 can be formed on an entire surface of the substrate 100 then planarized until the lower insulation layer 102 is exposed so that an auxiliary heating electrode 107' filling the first contact hole 104 is formed. Next, a heating electrode layer 110c, a phase change material layer 116, and an electrode layer 117 can be sequentially formed on an entire surface of the substrate 100 with the heating electrode layer 110c formed of the same material as the heating electrode 110a of FIG. 6.

Figure 11:
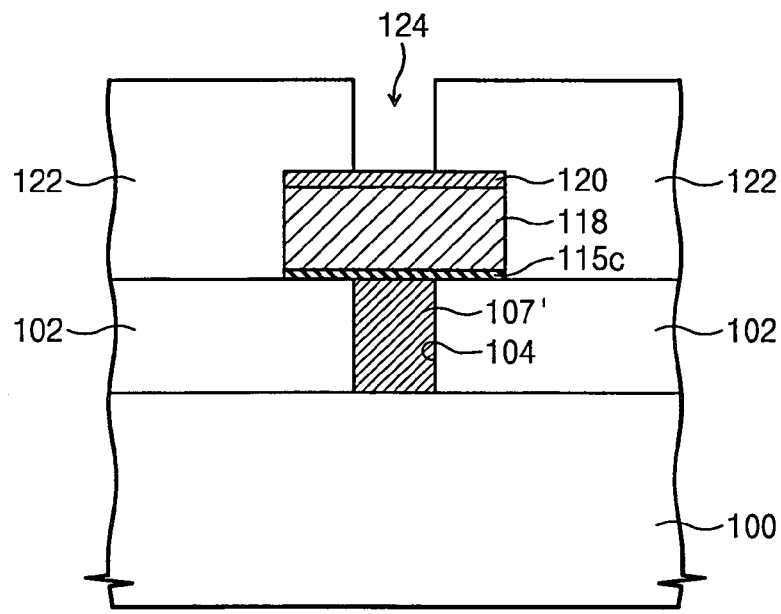

Referring next to FIG. 11, the electrode layer 117, the phase change material layer 116 and the heating electrode 110c can be patterned to form the heating electrode 115c, phase change material pattern 118 and electrode 120 respectively. The heating electrode 115c covers and makes contact with the auxiliary heating electrode 107'. The heating electrode 115c also makes contact with the entire lower surface of the phase change material pattern 118. An upper insulation layer 122 is then formed on the entire surface of the substrate 100 and patterned to form a contact hole 124 exposing the electrode 120. The plug 126 (of FIG. 4) and an electric line 128 (of FIG. 4) are then formed so that the PRAM illustrated in FIG. 4 can be finally realized.

Figure 12:
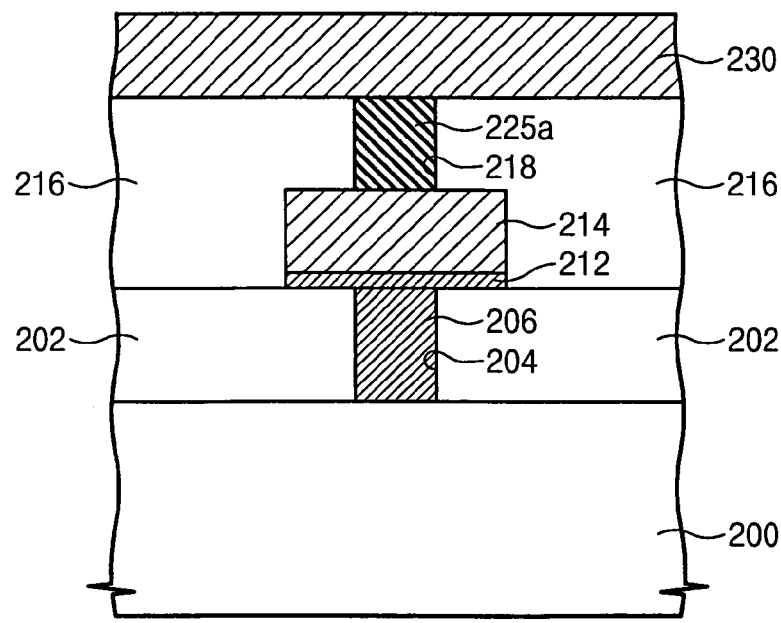
FIG. 12 is a cross-sectional view illustrating another illustrative embodiment of a PRAM according to an embodiment of the present invention.

The next illustrative embodiment depicts a memory element where a heating electrode contacts an upper surface of a phase change material pattern. As shown in FIG. 12, a lower insulation layer 202 made of silicon oxide or some other appropriate material is located on a substrate 200, and a plug 206 fills a first contact hole 204 passing through the lower insulation layer 202. The plug 206 may be formed of a conductive metal nitride such as titanium nitride, tantalum nitride, tungsten nitride, and titanium nitride aluminum.

An electrode 212 and a phase change material pattern 214 are sequentially stacked on the lower insulation layer 202. The electrode 212 can make contact with the plug 206, and the lower surface of the electrode 212 may be wider than an upper surface of the plug 206. The electrode 212 and the phase change material pattern 214 may be formed of the same materials as those of the electrode 120 (of FIG. 1) and the phase change material pattern 118 (of FIG. 1), respectively.

An upper insulation layer 216 can be formed to cover the entire surface of the substrate 200, and a second contact hole 218 can be formed to pass through the upper insulation layer 216 to expose a predetermined region of the phase change material pattern 214. The second contact hole 218 of the present embodiment may expose part of the upper surface of the phase change material pattern 214.

A heating electrode 225a can fill the second contact hole 218 to contact an upper surface of the phase change material pattern 214. Due to the nature of the second contact hole 218, the phase change material pattern 214 has a wider upper surface than the lower surface of the heating electrode 225a. The heating electrode 225a is formed of the same material as that of the heating electrode 115a of FIG. 1. That is, the heating electrode 225a is formed of a material having a positive temperature coefficient such that specific resistance of the material increases with temperature. Particularly, the heating electrode 225a may be formed of a material having a positive temperature coefficient and a critical temperature at which specific resistance of the material rapidly increases with temperature. In various embodiments, the heating electrode 225a may be formed of a barium titanate compound containing Ti, Ba and O. In addition, the heating electrode 225a may be formed of the barium titanate compound with at least one of La, Y, Gd, Sn, Ce, Sm, Dy, Nb, Sb, Ta, Pb, Sr, Zr, Mn, AlO and $SiO_2TiO_3$.

An electric line 230, formed of W, Al or Cu or some other appropriate material, may be located atop the upper insulation layer 216 to make contact with the heating electrode 225a.

According to a PRAM having the above-described structure, it may be desirable for the heating electrode 225a to have a low specific resistance during a read operation but also have a high specific resistance during a program operation when a high temperature is required. Consequently, as described above the specific resistance of the heating electrode 225a can be made to increase during program operations. Accordingly, even though less program current is required, sufficient heat is supplied to the phase change material pattern 214. As a consequence, a PRAM having low power consumption and high integration can be realized.

Also, as with the above examples the specific resistance of the heating electrode 225a can rapidly increase at some critical temperature, so that a switching characteristic of specific resistance of the heating electrode 225a is improved. Consequently, the time and power required for the program operations may be reduce. In addition, the specific resistance of the heating electrode 225a can be maintained low during the reading operation, so that read operations are also swiftly performed.

It should be appreciated that the heating electrode 225a may contact an upper surface of the phase change material pattern 214 in other manners as will be described below with reference to the accompanying drawings.

Figure 13:
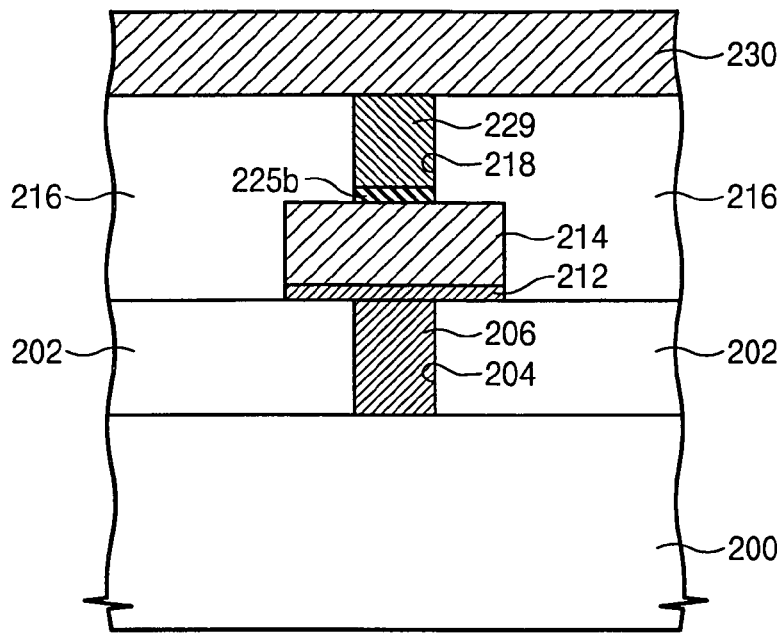
FIG. 13 is a cross-sectional view illustrating another illustrative embodiment of a PRAM according to an embodiment of the present invention.

FIG. 13 is a cross-sectional view of another illustrative embodiment of a PRAM. As shown in FIG. 13, a heating electrode 225b is located inside a second contact hole 218 passing through an upper insulation layer 216 and exposing part of a phase change material pattern 214. The heating electrode 225b makes contact with the upper surface of the phase change material pattern 214. The upper surface of the heating electrode 225b is lower than an upper surface of the upper insulation layer 216. Accordingly, the heating electrode 225b can fill a lower portion of the second contact hole 218. Note that the heating electrode 225b can be formed of the same material as that of the heating electrode 225a of FIG. 12.

An auxiliary heating electrode 229 fills the upper portion of the second contact hole 218. Note that the height/thickness of the auxiliary heating electrode 229 may be greater than the height/thickness of the heating electrode 225b with the heating electrode 225b having a thickness ranging from several angstrom to tens of nanometer. The auxiliary heating electrode 229 may be formed of a conductive metal nitride such as titanium nitride, tantalum nitride, tungsten nitride and titanium nitride aluminum. The electric line 230, located on the upper insulation layer 216, may make contact with the auxiliary heating electrode 229.

A PRAM having the above-described structure can obtain the same advantages as the PRAM illustrated in FIG. 12. However, due to the thinness of the heating electrode 225b the resistance of the heating electrode 225b can be minimized thus allowing read operations to be performed more swiftly.

Figure 14:
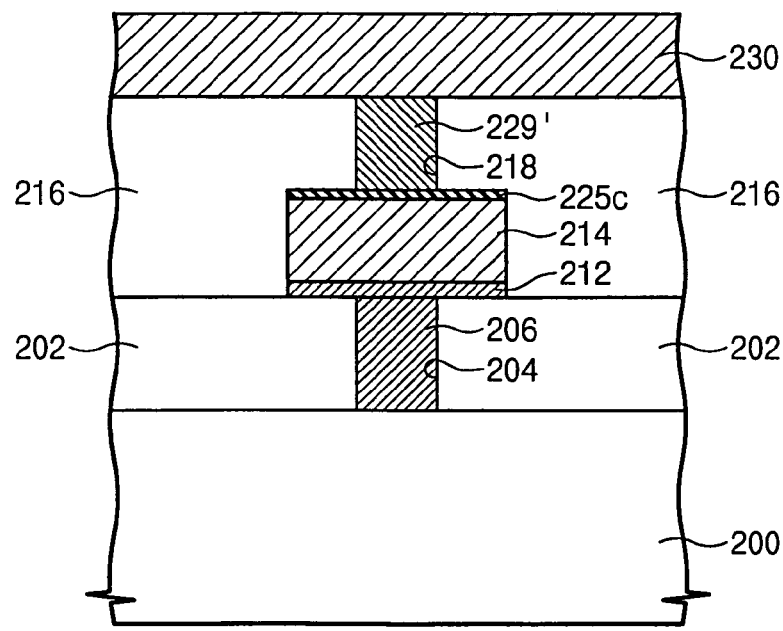
FIG. 14 is a cross-sectional view illustrating another illustrative embodiment of a PRAM according to an embodiment of the present invention.

FIG. 14 is a cross-sectional view of another embodiment of a PRAM. As shown in FIG. 14, a heating electrode 225c can be located on a phase change material pattern 214 to make contact with the entire upper surface of the phase change material pattern 214. Note that the heating electrode 225c has sidewalls aligned with sidewalls of the phase change material pattern 214 and electrode 212. The heating electrode 225c may have a thickness less than that of the electrode 212 with the heating electrode's thickness ranging from several angstrom to tens of nanometer. The heating electrode 225c is formed of the same material as that of the heating electrode illustrated in FIG. 12.

An upper insulation layer 216 covers the heating electrode 225c, the phase change material pattern 214, the electrode 212 and a lower insulation layer 202. An auxiliary heating electrode 229' is located inside a second contact hole 218 passing through the upper insulation layer 216 to make contact with a predetermined region of the heating electrode 225c. The auxiliary heating electrode 229' may be formed of the same material as that of the auxiliary heating electrode 229 illustrated in FIG. 13. An electric line 230 located on the upper insulation layer 216 can make contact with the auxiliary heating electrode 229'.

A PRAM having the heating electrode 225c of FIG. 14 may have the advantages described with reference to FIG. 12. Also, given that the exemplary heating electrode 225c is thin, resistance of the heating electrode 225c at low temperature can be minimized and read operations thus more swiftly performed.

Figure 15:
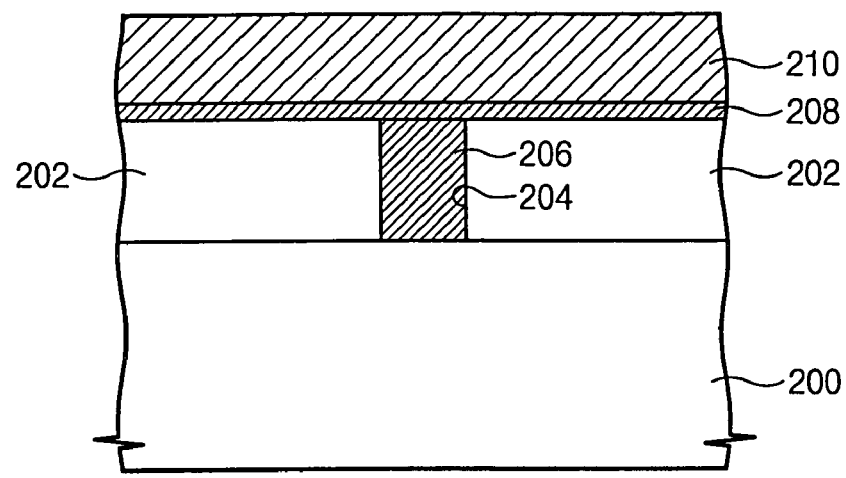
FIGS. 15 and 16 are sectional views explaining a method of forming the PRAM illustrated in FIG. 12.

Next, a method of forming the above-described PRAM of FIG. 12 will be described below with reference to FIGS. 15 and 16. Referring first to FIG. 15, a lower insulation layer 202 is formed on a substrate 200 and patterned to form a first contact hole 204 exposing the substrate 200. A plug layer filling the first contact hole 204 can then be formed on the entire surface of the substrate 200 and subsequently planarized until the lower insulation layer 202 is exposed so that a plug 206 filling the first contact hole 204 is formed. An electrode layer 208 and a phase change material layer 210 can be sequentially formed on the entire surface of the substrate 200.

The electrode layer 208 may be formed of a conductive metal nitride, such as titanium nitride, tantalum nitride, tungsten nitride and titanium nitride aluminum. The phase change material layer 210 may be formed of a compound including a combination of at least one of Te and Se, which are chalcogenide elements, and at least one of Ge, Sb, Bi, Pb, Sn, Ag, As, S, Si, P, O and N. For example, the phase change material layer 210 may be formed of a compound containing Ge—Sb—Te, As—Sb—Te, As—Ge—Sb—Te, Sn—Sb—Te, Ag—In—Sb—Te, In—Sb—Te, an element in a group 5A-Sb—Te, an element in a group 6A-Sb—Te, an element in a group 5A-Sb—Se or an element in a group 6A-Sb—Se.

Figure 16:
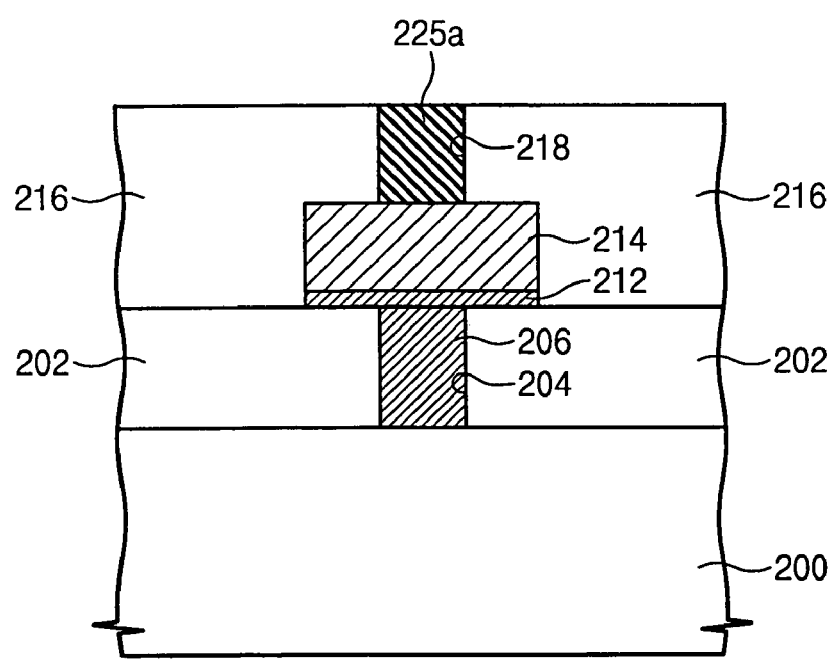

Continuing to FIG. 16, the phase change material layer 210 and the electrode layer 208 can be sequentially patterned to form a stacked electrode 212 and phase change material pattern 214 with the electrode 212 contacting the plug 206.

An upper insulation layer 216 can be formed on an entire surface of the substrate 200 and patterned to form a second contact hole 218 exposing part of an upper surface of the phase change material pattern 214.

A heating electrode layer filling the second contact hole 218 can be formed on the entire surface of the substrate 200, then planarized until the upper insulation layer 216 is exposed so that a heating electrode 225a filling the second contact hole 218 is formed. The electric wire illustrated in FIG. 12 can be formed on the upper insulation layer 216 so that the PRAM of FIG. 12 can be realized.

Figure 17:
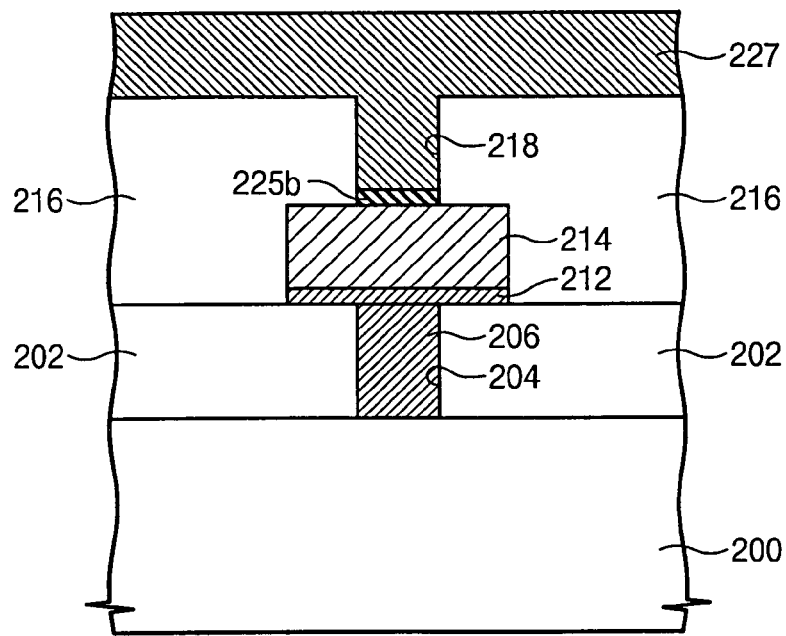
FIG. 17 is a cross-sectional view explaining a method of forming the PRAM illustrated in FIG. 13.

FIG. 17 is a cross-sectional view depicting a method of forming the PRAM illustrated in FIG. 13. This method may include all steps described with reference to FIGS. 15 and 16. Note that the upper surface of the heating electrode 225a illustrated in FIG. 16 is recessed to form a heating electrode 225b having an upper surface that is lower than an upper surface of an upper insulation layer 216 allowing the heating electrode 225b to be formed of the same material as that of the heating electrode 225a illustrated in FIG. 16.

An auxiliary heating electrode layer 227 filling a portion of a second contact hole 218 and located on the heating electrode 225b is formed on the substrate 200 and planarized until the upper insulation layer 216 is exposed so that the auxiliary heating electrode 229 of FIG. 13 is formed. At this point, the auxiliary heating electrode 229 corresponds to a portion of the auxiliary heating electrode layer 227 that fills the portion of the second contact hole 218. Subsequently, the electric line 230 illustrated in FIG. 13 is formed so that the PRAM of FIG. 13 can be realized.

Figure 18:
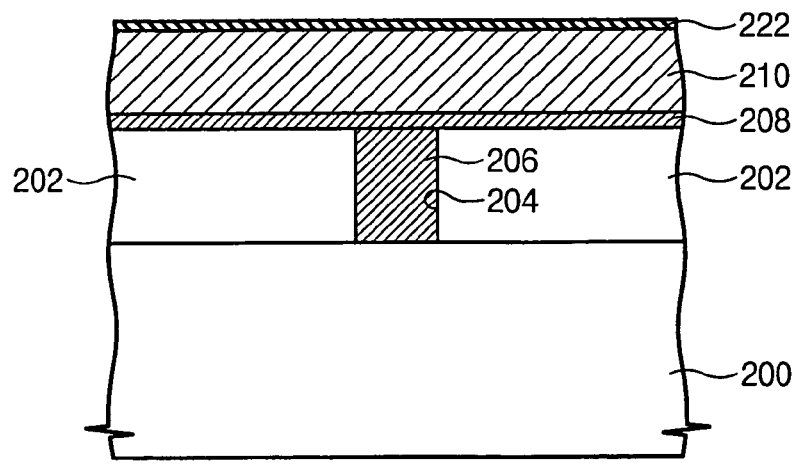
FIGS. 18 and 19 are cross-sectional views explaining a method of forming the PRAM illustrated in FIG. 14.
Figure 19:
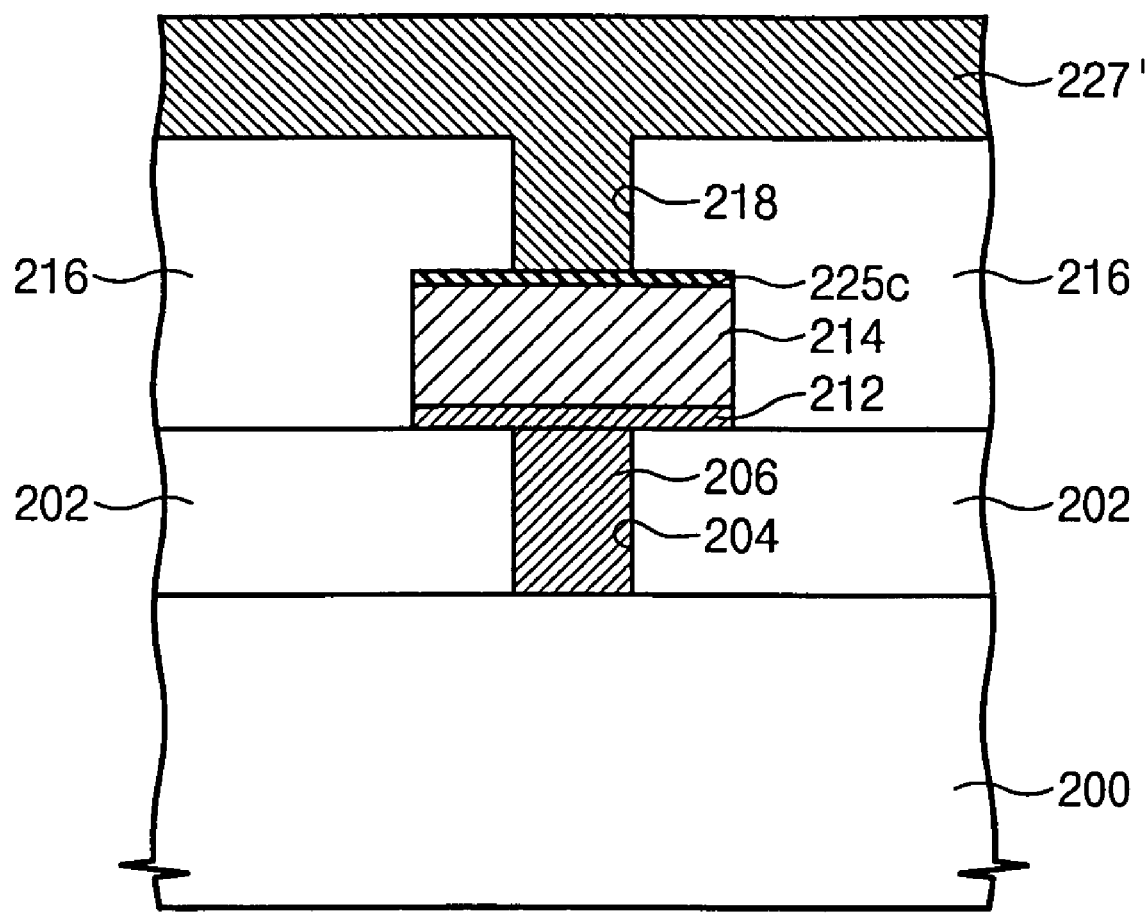

FIGS. 18 and 19 are cross-sectional views explaining a method of forming the PRAM illustrated in FIG. 14. Referring first to FIG. 18, it should be appreciated that the method of forming the PRAM illustrated in FIG. 14 may include all methods described with reference to FIG. 15. In detail, a heating electrode layer 222 (having a thickness of several angstrom to tens of nanometer) can be formed on the phase change material layer 210. The heating electrode layer 222 may be thinner than an electrode layer 208.

Referring to FIG. 19, the heating electrode layer 222, the phase change material layer 210 and the electrode layer 208 can be sequentially patterned to form a stack containing electrode 212, phase change material pattern 214 and heating electrode 225c.

An upper insulation layer 216 can then be formed on the entire surface of a substrate 200 and patterned to form a second contact hole 218 exposing part or all of the heating electrode 225c.

An auxiliary heating electrode layer 227' filling the second contact hole 218 is then formed on the entire surface of the substrate 200 and planarized until the upper insulation layer 216 is exposed so that the auxiliary heating electrode 229' of FIG. 14 is formed. Subsequently, the electric line 230 of FIG. 14 can be formed so that the PRAM of FIG. 14 is finally realized.

As discussed above, the various heating electrodes contacting the phase change material pattern can be formed of a material having specific resistance that increases with temperature thus allowing for faster program operations using less energy while also enabling fast read operations due to the low specific resistance when the heating electrode is relatively cool.

Also, as the heating electrode can have a critical temperature at which specific heat of the heating electrode rapidly increases, the switching characteristic of the heating electrode can be improved, and as a consequence program operation may take less time.

Further, by using a thin heating electrode resistance may be minimized at low temperature and as a consequence read operations may be more swiftly performed.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A phase change random access memory (PRAM) device, comprising:
   a heating electrode in contact with a phase change material pattern, wherein the heating electrode is formed of a material having a positive temperature coefficient such that the specific resistance of the heating electrode material increases with increasing temperatures,
   wherein the heating electrode is formed of a material having a critical temperature at which specific resistance of the material rapidly increases,
   wherein the heating electrode is formed of a material containing Ti, Ba, and O, and
   wherein the heating electrode is formed of a material further including at least one selected from the group consisting of La, Y, Gd, Sn, Ce, Sm, Dy, Nb, Sb, Ta, Pb, Sr, Zr, Mn, AlO and $SiO_2TiO_3$.

2. The PRAM of claim 1, further comprising:
   a lower insulation layer formed on a semiconductor substrate, wherein the phase change material pattern is formed on the lower insulation layer.

3. The PRAM of claim 2, wherein the heating electrode fills a contact hole passing through the lower insulation layer located under the phase change material pattern to contact a lower surface of the phase change material pattern.

4. The PRAM of claim 2, wherein the heating electrode is located inside a contact hole passing through the lower insulation layer under the phase change material pattern to contact a lower surface of the phase change material pattern, the PRAM further comprises an auxiliary heating electrode filling a portion of the contact hole, located under the heating electrode and in contact with a lower surface of the heating electrode, and wherein an area of the lower surface of the heating electrode is substantially the same as an area of an upper surface of the auxiliary heating electrode.

5. The PRAM of claim 2, wherein the heating electrode is interposed between the phase change material pattern and the lower insulation layer to contact an entire lower surface of the phase change material pattern.

6. The PRAM of claim 2, further comprising an upper insulation layer substantially covering an entire surface of the substrate, wherein the heating electrode fills a contact hole passing through the upper insulation layer, and exposing the phase change material pattern to contact an upper surface of the phase change material pattern, and wherein the phase change material pattern is disposed outside the contact hole.

7. A phase change random access memory (PRAM) device comprising:
   a heating electrode in contact with a phase change material pattern, wherein the heating electrode is formed of a material having a positive temperature coefficient such that the specific resistance of the heating electrode material increases with increasing temperature;
   a lower insulation layer formed on a semiconductor substrate, wherein the phase change material pattern is formed on the lower insulation layer;
   an upper insulation layer covering the substrate; and
   an auxiliary heating electrode located inside a contact hole passing through the upper insulation layer and exposing the phase change material pattern, wherein the heating electrode is located inside a portion of the contact hole that is located between the phase change material pattern and the auxiliary heating electrode to contact an upper surface of the phase change material pattern.

8. The PRAM of claim 2, wherein the heating electrode is located on the phase change material pattern to contact an entire upper surface of the phase change material pattern, and wherein the PRAM further comprises:
   an upper insulation layer covering an entire surface of the substrate; and
   an auxiliary heating electrode filling a contact hole passing through the upper insulation layer and exposing the heating electrode, so that the auxiliary heating electrode contacts the heating electrode.

9. A method of forming a PRAM, the method comprising:
   forming a phase change material pattern and a heating electrode with the heating electrode contacting the phase change material pattern, wherein the heating electrode is formed of a material having a positive temperature coefficient such that specific resistance of the material increases with temperatures,
   wherein the heating electrode is formed of a material having a critical temperature at which specific resistance of the material rapidly increases,
   wherein the heating electrode is formed of a material containing Ti, Ba, and O, and
   wherein the heating electrode is formed of a material further including at least one selected from the group consisting of La, Y, Gd, Sn, Ce, Sm, Dy, Nb, Sb, Ta, Pb, Sr, Zr, Mn, AlO and $SiO_2TiO_3$.

10. The method of claim 9, further comprising:
    forming a lower insulation layer on a semiconductor substrate, wherein the phase change material pattern is disposed on the lower insulation layer.

11. The method of claim 10, wherein the forming of the phase change material pattern and the heating electrode comprises:
    patterning the lower insulation layer to form a contact hole;
    forming the heating electrode that fills the contact hole; and
    forming the phase change material pattern contacting the heating electrode on the lower insulation layer.

12. The method of claim 10, wherein the forming of the phase change material pattern and the heating electrode comprises:
    patterning the lower insulation layer to form a contact hole;

forming an auxiliary heating electrode that fills a portion of the contact hole;

forming the heating electrode that fills a portion of the contact hole that remains on the auxiliary heating electrode; and forming the phase change material pattern contacting the heating electrode on the lower insulation layer, wherein an area of a lower surface of the heating electrode is substantially the same as an area of an upper surface of the auxiliary heating electrode.

13. The method of claim 10, wherein the forming of the phase change material pattern and the heating electrode comprises:

patterning the lower insulation layer to form a contact hole;

forming an auxiliary heating electrode that fills the contact hole; and forming the heating electrode and the phase change material pattern sequentially stacked on the lower insulation layer, wherein the heating electrode contacts the auxiliary heating electrode, and the heating electrode contacts substantially an entire lower surface of the phase change material pattern.

14. The method of claim 10, wherein the forming of the heating electrode comprises:

forming an upper insulation layer covering the lower insulation layer and the phase change material pattern;

patterning the upper insulation layer to form a contact hole that exposes the phase change material pattern; and forming the heating electrode that fills the contact hole in the upper insulation layers, wherein the phase change material pattern is disposed outside the contact hole.

15. The method of claim 10, wherein the forming of the phase change material pattern and the heating electrode comprises:

sequentially forming a phase change material layer and a heating electrode layer on the lower insulation layer; and successively patterning the heating electrode layer and the phase change material layer to form the sequentially stacked the phase change material pattern and the heating electrode;

forming an upper insulation layer covering an entire surface of the substrate;

patterning the upper insulation layer to form a contact hole that exposes the heating electrode; and forming an auxiliary heating electrode that fills the contact hole.

16. A method of forming a PRAM, the method comprising:

forming a phase change material pattern and a heating electrode with the heating electrode contacting the phase change material pattern, wherein the heating electrode is formed of a material having a positive temperature coefficient such that specific resistance of the material increases with temperature;

forming a lower insulation layer on a semiconductor substrate, wherein the phase change material pattern is disposed on the lower insulation;

forming an upper insulation layer covering the lower insulation layer and the phase change material pattern;

patterning the upper insulation layer to form a contact hole that exposes the phase change material pattern;

forming the heating electrode filling a portion of the contact hole to be contact with the phase change material pattern; and forming an auxiliary heating electrode that fills a portion of the contact hole that remains on the heating electrode.

\* \* \* \* \*